United States Patent
Park (10) Patent No.: US 10,755,784 B2
(45) Date of Patent: Aug. 25, 2020

(54) MEMORY DEVICE AND MEMORY SYSTEM HAVING THE SAME

(71) Applicant: SK hynix Inc., Gyeonggi-do (KR)

(72) Inventor: Won Sun Park, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 16/255,936

(22) Filed: Jan. 24, 2019

(65) Prior Publication Data

US 2019/0295650 A1 Sep. 26, 2019

(30) Foreign Application Priority Data

Mar. 26, 2018 (KR) .................. 10-2018-0034677

(51) Int. Cl.
| | | |
|---|---|---|
| *G11C 16/10* | (2006.01) | |
| *G11C 16/04* | (2006.01) | |
| *G11C 16/14* | (2006.01) | |
| *G06F 3/06* | (2006.01) | |
| *G11C 16/08* | (2006.01) | |
| *G11C 16/26* | (2006.01) | |

(52) U.S. Cl.
CPC ........ *G11C 16/0483* (2013.01); *G06F 3/0604* (2013.01); *G06F 3/0659* (2013.01); *G06F 3/0679* (2013.01); *G11C 16/08* (2013.01); *G11C 16/10* (2013.01); *G11C 16/14* (2013.01); *G11C 16/26* (2013.01)

(58) Field of Classification Search
CPC .................................. G11C 7/00; G11C 29/08
USPC ........................................... 365/189.011, 201
See application file for complete search history.

(56) References Cited

U.S. PATENT DOCUMENTS

| | | | | |
|---|---|---|---|---|
| 4,649,412 A | * | 3/1987 | Iwase .................. | H01L 23/5226 148/DIG. 82 |
| 5,124,948 A | * | 6/1992 | Takizawa ............. | G11C 29/822 365/104 |
| 5,640,353 A | * | 6/1997 | Ju .......................... | G11C 29/76 365/189.07 |
| 5,671,239 A | * | 9/1997 | Higashitani ......... | G06F 11/1008 714/805 |
| 5,682,466 A | * | 10/1997 | Maeda ..................... | G06K 9/64 706/46 |
| 5,953,268 A | * | 9/1999 | Kuhara .................. | G11C 29/36 365/200 |

(Continued)

FOREIGN PATENT DOCUMENTS

| | | |
|---|---|---|
| KR | 10-1083166 | 11/2011 |
| KR | 1020160069584 | 6/2016 |

*Primary Examiner* — Michael T Tran
(74) *Attorney, Agent, or Firm* — IP & T Group LLP (57) ABSTRACT

The memory device includes: an independent circuit configured to output an independent signal; a memory cell array formed on a top of the independent circuit, the memory cell array including a plurality of memory cells in which data is stored; a revision circuit formed on a top of the memory cell array, the revision circuit storing modified ROM data different from the independent signal, the revision circuit outputting a ROM control signal and the modified ROM data in response to a select signal when an error occurs in the independent signal in a test operation of the independent circuit formed under the memory cell array; and a selection circuit configured to output the independent signal or the modified ROM data in response to the ROM control signal.

21 Claims, 8 Drawing Sheets

(56) References Cited

U.S. PATENT DOCUMENTS

| | | | | |
|---|---|---|---|---|
| 5,986,952 | A | * | 11/1999 | McConnell .......... G11C 11/005 365/200 |
| 2004/0037122 | A1 | * | 2/2004 | Cho .................... G11C 29/822 365/200 |
| 2006/0273182 | A1 | * | 12/2006 | Iwata ..................... H01L 27/10 235/492 |
| 2007/0121402 | A1 | * | 5/2007 | Ohshima ............... G11C 17/12 365/203 |
| 2010/0161885 | A1 | * | 6/2010 | Kanno ................. G11C 16/105 711/103 |
| 2014/0245011 | A1 | * | 8/2014 | Nagai .................... H04L 63/06 713/171 |
| 2015/0074394 | A1 | * | 3/2015 | Nagai ................... H04L 9/0838 713/168 |
| 2018/0165025 | A1 | * | 6/2018 | Murakami ............. G11C 16/16 |
| 2019/0066752 | A1 | * | 2/2019 | Fackenthal ......... G11C 11/2275 |
| 2019/0066802 | A1 | * | 2/2019 | Malshe ................. G11C 16/26 |

* cited by examiner

MEMORY DEVICE AND MEMORY SYSTEM HAVING THE SAME

CROSS-REFERENCE TO RELATED APPLICATION

The present application claims priority under 35 U.S.C. § 119(a) to Korean patent application number 10-2018-0034677, filed on Mar. 26, 2018, which is incorporated herein by reference in its entirety.

BACKGROUND

1. Field of Invention

The present disclosure generally relates to a memory device and, more particularly, to a memory device including a read-only-memory (ROM) and a memory system including the same.

2. Description of Related Art

A memory system may include a storage device and a memory controller for controlling the operations of the storage device and for operatively coupling the storage device to a host.

The storage device may include a plurality of memory devices, and the memory devices may store data or output stored data. For example, the memory devices may be configured as volatile memory devices, in which stored data disappears when the supply of power is interrupted, or may be configured as nonvolatile memory devices, in which stored data is retained even when the supply of power is interrupted.

The memory controller may control data communication between a host and the storage device.

The host may communicate with the memory device through the memory controller by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host and the memory system are not limited to the above-described examples, and may include various interfaces such as a Universal Serial Bus (USB), a Multi-Media Card (MMC), an Enhanced Small Disk Interface (ESDI), and Integrated Drive Electronics (IDE).

In order to increase data storage capacities of memory devices, a memory device having a three-dimensional structure, which has an improved degree of integration, has recently been developed.

SUMMARY

Embodiments of the present invention provide a memory device having an improved ROM, and a memory system having the memory device. The memory device may correct output data of a ROM. In accordance with an aspect of the present disclosure, there is provided a memory device including: an independent circuit configured to output an independent signal; a memory cell array formed on a top of the independent circuit, the memory cell array including a plurality of memory cells in which data is stored; a revision circuit formed on a top of the memory cell array, the revision circuit storing modified ROM data different from the independent signal, the revision circuit outputting a ROM control signal and the modified ROM data in response to a select signal when an error occurs in the independent signal in a test operation of the independent circuit formed under the memory cell array; and a selection circuit configured to output the independent signal or the modified ROM data in response to the ROM control signal.

In accordance with another aspect of the present disclosure, there is provided a memory device including: operating circuits formed on a top of a substrate; an independent circuit formed on a top of the operating circuits, the independent circuit outputting an independent signal; a selection circuit formed on the top of the operating circuits, the selection circuit outputting the independent signal or modified ROM data in response to a ROM control signal; a memory cell array formed on a top of a NAND ROM and the selection circuit; and a revision circuit formed on a top of the memory cell array, the revision circuit transmitting the modified ROM data to the selection circuit in response to a select signal.

In accordance with still another aspect of the present disclosure, there is provided a memory system including: a memory device configured to store user data and output an independent signal; and a memory controller configured to transmit a modification command to the memory device to modify and output the independent signal, wherein the memory device includes: a memory cell array configured to store the user data; an independent circuit formed on a bottom of the memory cell array, the independent circuit outputting the independent signal; a revision circuit formed on a top of the memory cell array, the revision circuit storing modified ROM data different from the independent signal, the revision circuit outputting a ROM control signal and the modified ROM data in response to a select signal; and a selection circuit configured to output the independent signal or the modified ROM data in response to the ROM control signal.

In accordance with still another aspect of the present disclosure, there is provided a memory system including: a memory cell array of a three-dimensional structure; a first circuit formed on a first side of the memory cell array and configured to output a first signal that cannot be modified; a second circuit formed on a second side of the memory cell array and configured to output a second signal substituting the first signal; and a selector circuit configured to select one between the first and second signals to control the memory cell array in response to a control signal.

BRIEF DESCRIPTION OF THE DRAWINGS

Example embodiments of the present invention will now be described more fully hereinafter with reference to the accompanying drawings; however, it is noted that the present invention may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
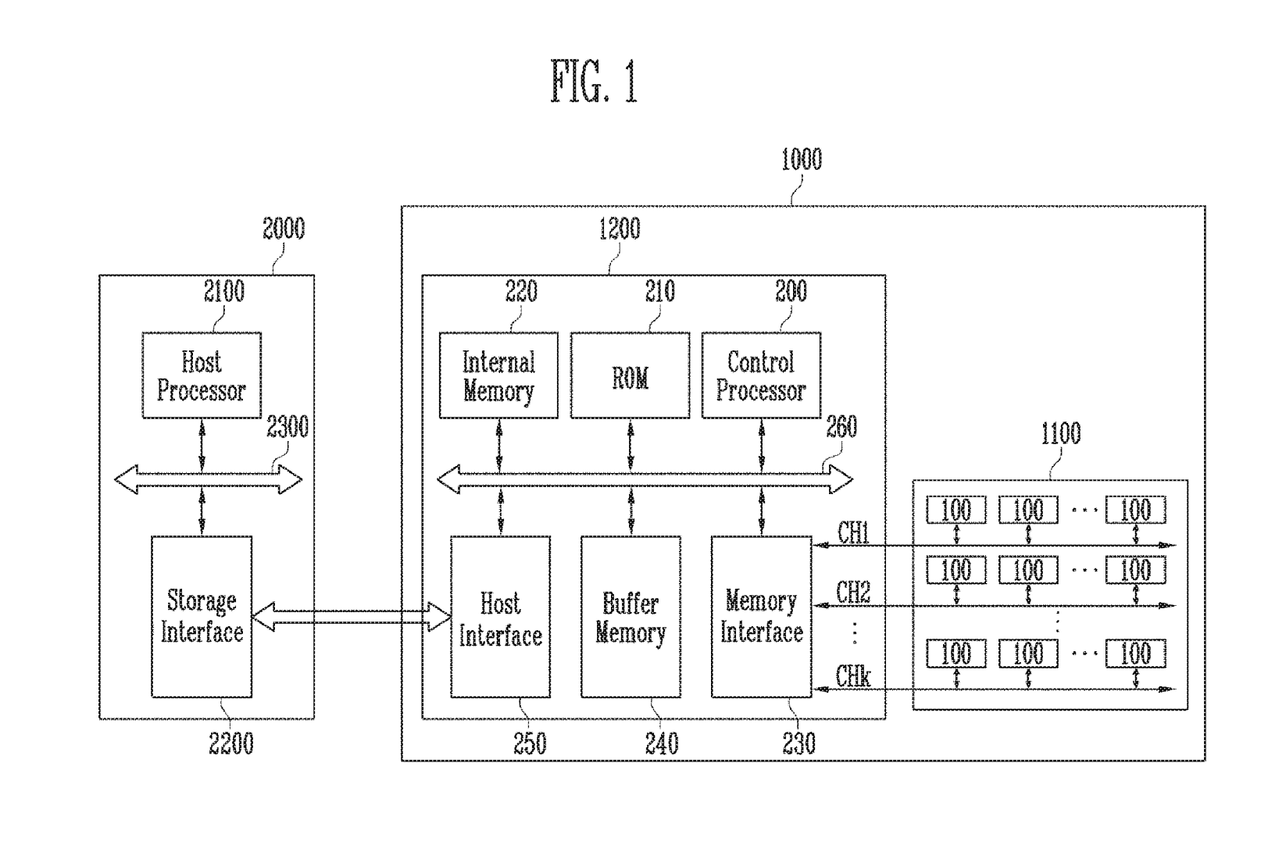
FIG. 1 is a diagram illustrating a memory system operatively coupled to a host in accordance with an embodiment of the present disclosure.

FIG. 1 is a diagram illustrating a memory system in accordance with an embodiment of the present disclosure.

Referring to FIG. 1, the memory system 1000 may include a storage device 1100 for storing data and a memory controller 1200 for communicating between the storage device 1100 and a host 2000.

The storage device 1100 may include a plurality of memory devices 100. For example, the memory devices 100 may be implemented with volatile memory devices in which stored data is extinguished when the supply of power is interrupted or nonvolatile memory devices in which stored data is retained when the supply of power is interrupted. For example, the memory devices 100 may be implemented with NAND flash memory devices.

The memory devices 100 may be connected to the memory controller 1200 via a plurality of channels CH1 to CHk. For example, as illustrated in the embodiment of FIG. 1, plurality of memory devices 100 may be connected to each of first to kth channels CH1 to CHk.

The memory controller 1200 may include a control processor 200, a ROM 210, an internal memory 220, a memory interface 230, a buffer memory 240, and a host interface 250.

The control processor 200 may perform various operations for controlling the storage device 1100 which may include generating a command and an address to be transmitted to the storage device 1100. For example, the control processor 200 may check a status of the storage device 1100 by generating a status check command for a status check operation, and generate a command for controlling the storage device 1100, based on the check result. Also, the control processor 200 may run firmware according to a ROM code output from the ROM 210.

The ROM 210 may include a nonvolatile memory device in which information is retained even when power supply is interrupted. For example, a plurality of fuse data and ROM codes may be stored in the ROM 210.

The internal memory 220 may store various information necessary for an operation of the memory controller 1200. For example, the internal memory 220 may include a logical-physical address map table. For example, a logical address may be entered into the internal memory 220, then the controller 1200 may generate a physical address corresponding to the received logical address and transmit the physical address to the storage device 1100. For example, hen a physical address is inputted to the internal memory 220, a logical address corresponding to the input physical address may be generated according to the address map table and send to one or more of the memory devices 100 of the storage device 1100. For example, the logical address may be received from the host 2000 via the storage and host interfaces 2200 and 250 and inputted to the internal memory 220. The physical address which may be generated by the processor 200 of the controller 1200 based on the logical-physical address map table may be transmitted to the storage device 1100. The internal memory 220 may be configured with at least one of a Random-Access Memory (RAM), a Dynamic RAM (DRAM), a Static RAM (SRAM), and a Tightly Coupled Memory (TCM).

The memory interface 230 may exchange a command, an address, data, and the like between the memory controller 1200 and the storage device 1100. For example, the memory interface 230 may transmit a command, an address, data, and the like to the memory devices 100 through the first to kth channels CH1 to CHk, and receive data and the like from the memory devices 100. The command may be an internal command. The address may be a physical address.

The buffer memory 240 may temporarily store data when an operation of the memory system 1000 is performed. For example, in a program operation, the buffer memory 240 may temporarily store original program data until the program operation of a selected memory device 100 passes. Alternatively, in a read operation, the buffer memory 240 may temporarily store data read from the memory device 100 and then sequentially transmit the data to the host interface 250. The buffer memory 240 may be configured with an SRAM or DRAM.

The host interface 250 may exchange a command, an address, data, and the like between the memory controller 1200 and the host 2000. For example, the host interface 250 may receive a command, an address, data, and the like from the host 2000, and transmit data and the like to the host 2000. The command may be an external command. The address may be a logical address.

The control processor 200, the ROM 210, the internal memory 220, the memory interface 230, the buffer memory 240, and the host interface 250 may communicate with each other through a bus 260.

The host 2000 may include a host processor 2100 and a storage interface 2200. The host processor 2100 and the storage interface 2200 may communicate with each other through a bus 2300.

The host processor 2100 may generate a program request capable of controlling the program operation of the memory system 1000 or a read request capable of controlling the read operation of the memory system 1000. For example, the program request may include a program external command and a logical address, which are transmitted to the memory system 1000. For example, the read request may include a read external command and a logical address, which are transmitted to the memory system 1000. In addition, various operation requests such as an erase request may be controlled.

The storage interface 2200 may communicate with the memory system 1000 by using an interface protocol such as a Peripheral Component Interconnect express (PCIe), an Advanced Technology Attachment (ATA), a Serial ATA (SATA), a Parallel ATA (PATA), a Serial Attached SCSI (SAS) or a Non-Volatile Memory express (NVMe). The storage interface 2200 is not limited to the above-described examples, and may include various other interfaces such as a Universal Serial Bus (USB), a Multi-Media Card (MMC), an Enhanced Small Disk Interface (ESDI), and Integrated Drive Electronics IDE.

Figure 2:
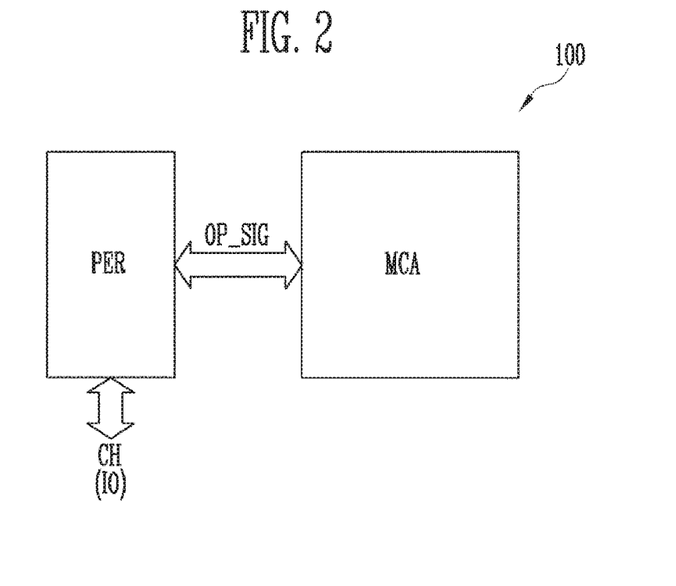
FIG. 2 is a diagram schematically illustrating a memory device shown in FIG. 1.

FIG. 2 is a diagram schematically illustrating the memory device 100 of FIG. 1.

Referring to FIG. 2, the memory device 100 may include a memory cell array MCA for storing data and a peripheral circuit PER configured to perform a program operation, a read operation, an erase operation or the like to the memory cell array MCA.

The memory cell array MCA may include a plurality of memory blocks. The memory blocks may include a plurality of memory cells.

The peripheral circuit PER may receive a program command, an address, data, and the like from the memory controller 1200 of FIG. 1 through a channel CH, and perform a program operation of the memory cell array MCA by generating operation signals OP_SIG for the program operation. Also, the peripheral circuit PER may perform a read operation of the memory cell array MCA by generating operation signals OP_SIG for the read operation in response to a read command and an address, and output read data to the memory controller 1200 through the channel CH. The channel CH may be configured with a plurality of input/output lines IO.

The memory cell array MCA and the peripheral circuit PER will be described in more detail as follows.

Figure 3:
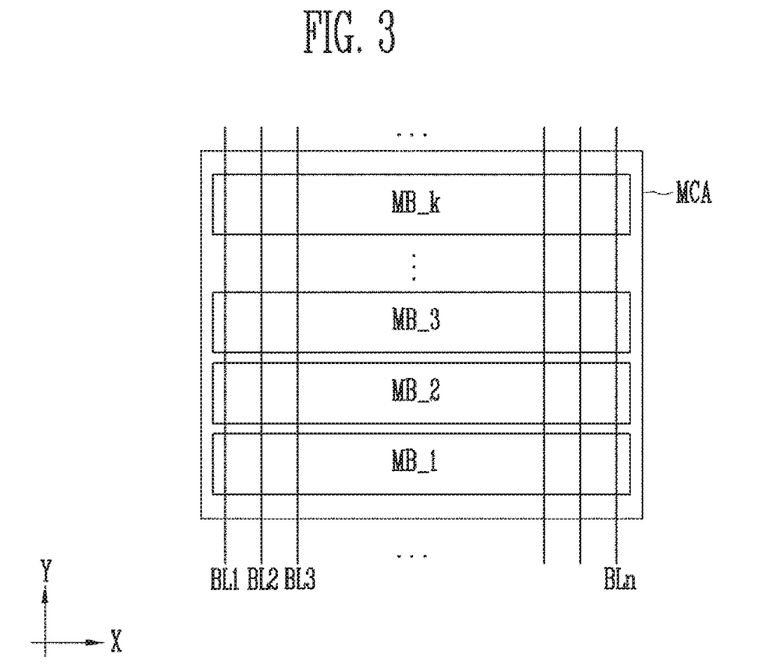
FIG. 3 is a diagram illustrating a memory cell array shown in FIG. 2.

FIG. 3 is a diagram illustrating the memory cell array of FIG. 2.

Referring to FIG. 3, the memory cell array MCA may include a plurality of memory blocks, e.g., first to kth memory blocks MB_1 to MB_k (k is a positive integer). In the case of a NAND flash memory device, the first to kth memory blocks MB_1 to MB_k may be commonly coupled to first to nth bit lines BL1 to BLn (n is a positive integer) arranged in a first direction X.

The first to kth memory blocks MB_1 to MB_k may be arranged along a second direction Y orthogonal to the first direction X.

Figure 4:
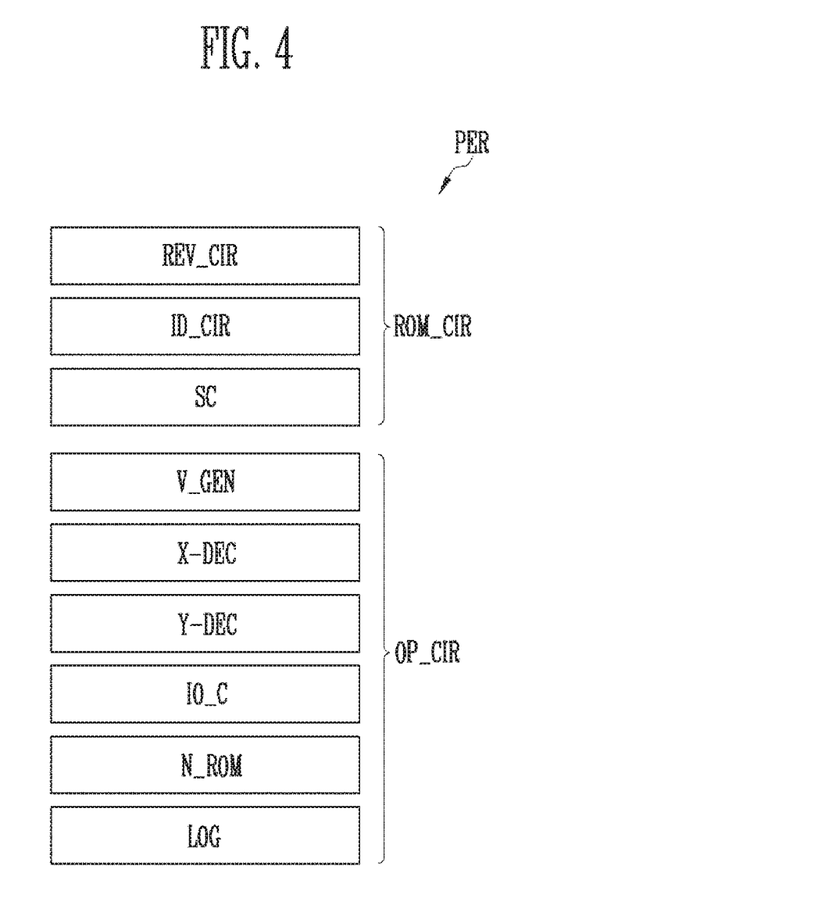
FIG. 4 is a diagram illustrating a peripheral circuit shown in FIG. 2.

FIG. 4 is a diagram illustrating the peripheral circuit of FIG. 2.

Referring to FIG. 4, the peripheral circuit PER may include a plurality of operating circuits OP_CIR for performing various operations such as program, read, and erase operations and ROM circuits ROM_CIR for storing system data and the like, which are internally used in the memory system 1000 of FIG. 1.

The operating circuits OP_CIR may include a voltage generation circuit V_GEN, a row decoder X-DEC, a column decoder Y-DEC, an input/output circuit IO_C, a NAND ROM N_ROM, and a control logic LOG.

The control logic LOG may output operation control signals for controlling the voltage generation circuit V_GEN, the row decoder X-DEC, the column decoder Y-DEC, the input/output circuit IO_C, and the ROM circuits ROM_CIR in response to a command and an address, which are received from the memory controller 1200.

The voltage generation circuit V_GEN may generate a program voltage, a read voltage, an erase voltage, or the like under the control of the control logic LOG. In addition, the voltage generation circuit V_GEN may generate voltages used in various operations.

The row decoder X-DEC may select one memory block among the memory blocks according to a row address included in an address received to the memory device 100, and transmit voltages generated from the voltage generation circuit V_GEN to the selected memory block.

The column decoder Y-DEC may receive data from the input/output circuit IO_C or transmit data to the input/output circuit IO_C according to a column address included in the address received to the memory device 100. The column decoder Y-DEC may include page buffers for temporarily storing data in a program or read operation.

The input/output circuit IO_C may receive or output a command, an address or data through the input/output lines IO of FIG. 2. For example, the memory device 100 may receive a command, an address, and data through the input/output circuit IO_C in a program operation, and output data through the input/output circuit IO_C in a read operation.

The NAND ROM N_ROM is shown as a separate circuit in the illustration of FIG. 4. However, it is noted that this is just an exemplary configuration and it is not intended to limit the scope of the present invention. In variations of the described embodiment, the NAND ROM N_ROM may be included in the control logic LOG. Also, the position of the NAND ROM N_ROM is not limited to the position shown in the illustration of FIG. 4. Generally, the NAND ROM N_ROM may be positioned in any suitable region or portion of the peripheral circuit PER.

The NAND ROM N_ROM may store system data and code (software). The system data may be different from user data which are stored in the memory cell array MCA. The code and the system data, may be used for controlling an operation of the memory device 100. The code and the system data, which are stored in the NAND ROM N_ROM, cannot be modified after packaging of the memory system 1000. Some circuits may operate or output data or signals according to the code and/or system data retrieved from the NAND ROM N_ROM. However, some circuits cannot be modified according to the code and/or system data retrieved from the NAND ROM N_ROM. A circuit of the peripheral circuit PER of the memory device 100 that cannot be modified according to the code and/or system data retrieved from the NAND ROM N_ROM is referred to hereinafter as an independent circuit ID_CIR and an output signal is referred to as an independent signal.

The ROM circuits ROM_CIR may include a selection circuit SC, the independent circuit ID_CIR, and a revision circuit REV_CIR.

The selection circuit SC may selectively output revision ROM data in response to a ROM control signal.

The independent circuit ID_CIR may include one or more circuits that cannot be modified by the NAND ROM N_ROM.

The revision circuit REV_CIR may output revised data to be used instead of the independent signal of the independent circuit ID_CIR that cannot be revised by the NAND ROM N_ROM. That is, since the independent signal output from the independent circuit ID_CIR cannot be modified, the revision circuit REV_CIR may store data to be output instead of the independent signal.

The memory cell array MCA of FIG. 3 and the peripheral circuit PER of FIG. 4 may be formed by being arranged in parallel to each other on a substrate or by being vertically stacked on the substrate. In this embodiment, in order to improve the degree of integration of the memory device 1000, the memory device 100 having a three-dimensional structure in which the peripheral circuit PER and the memory cell array MCA are stacked on each other will be described as an example.

Figure 5:
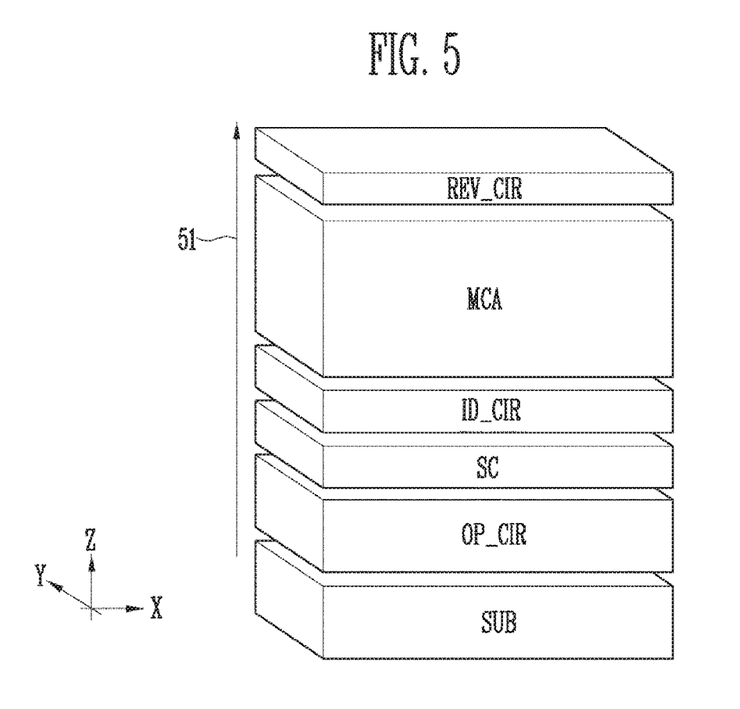
FIG. 5 is a diagram illustrating a structure of a memory device in accordance with an embodiment of the present disclosure.

FIG. 5 is a diagram illustrating a structure of the memory device 100 in accordance with an embodiment of the present disclosure.

Referring to FIG. 5, the operating circuits OP_CIR, the selection circuit SC, the independent circuit ID_CIR, the memory cell array MCA, and the revision circuit REV_CIR may be sequentially stacked on the substrate SUB. For example, when assuming that the bit lines BL1 to BLn of FIG. 3 are arranged in a first direction X and the bit lines BL1 to BLn extend in a second direction Y, the operating circuits OP_CIR, the selection circuit SC, the independent circuit ID_CIR, the memory cell array MCA, and the revision circuit REV_CIR may be stacked in a third direction Z orthogonal to the first and second directions X and Y. That is, in a sequence S1 of manufacturing processes, the operating circuits OP_CIR, the selection circuit SC, the independent circuit ID_CIR, the memory cell array MCA, and the revision circuit REV_CIR may be sequentially formed on the substrate SUB. The selection circuit SC and the independent circuit ID_CIR may be reversely stacked, or be formed in the same layer.

The independent circuit ID_CIR is used to output the independent signals required to perform an operation of the memory device 100. Therefore, the independent circuit ID_CIR may be formed in an area close to the operating circuits OP_CIR so as to prevent increase in size of the memory device 100 and reduce an operating time.

The revision circuit REV_CIR may be used when there is a need for modifying the independent signal output from the independent circuit ID_CIR after the circuits up to the memory cell array MCA are formed. For example, when an error occurs in the independent signal output from the independent circuit ID_CIR in a test operation after circuits from the operating circuits OP_CIR to the memory cell array MCA are formed, it is difficult to revise the independent circuit ID_CIR formed on the bottom of the memory cell array MCA. Thus, in this embodiment, the revision circuit REV_CIR is formed on the top of the memory cell array MCA. When the independent signal output from the independent circuit ID_CIR is required to be corrected, the revision circuit REV_CIR may output modified signal or data instead of the independent signal output from the independent circuit ID_CIR.

An operating method of the selection circuit SC, the independent circuit ID_CIR, and the revision circuit REV_CIR will be described as follows.

Figure 6:
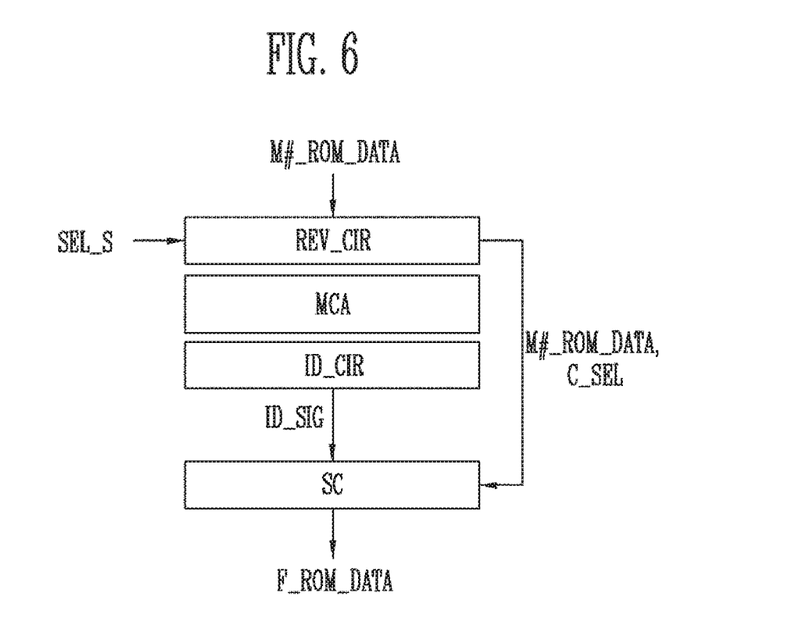
FIG. 6 is a diagram illustrating an implementation method of a ROM circuit shown in FIG. 5.

FIG. 6 is a diagram illustrating an implementation method of the ROM circuits ROM_CIR of FIG. 5.

Referring to FIG. 6, after the independent circuit ID_CIR is manufactured, the independent circuit ID_CIR may output only the independent signal ID_SIG that cannot be modified using the code and system data from the NAND ROM N_ROM. As shown in FIG. 6, the independent signal ID_SIG output from the independent circuit ID_CIR is not directly transferred to the operating circuit OP_CIR of FIG. 5, but may instead selectively transferred to the operating circuit OP_CIR through the selection circuit SC.

Modified ROM data M#_ROM_DATA which are different from the independent signal ID_SIG may be stored in the revision circuit REV_CIR. The hash symbol '#' may be used as an identification mark. For example, '#' may be used to represent an address or sector corresponding to the modified ROM data. In the following described embodiment, it is assumed that '#' is used as a sector identification mark.

The revision circuit REV_CIR may output selected modified ROM data M#_ROM_DATA among plural pieces of modified ROM data M#_ROM_DATA stored therein in response to a select signal SEL_S. The revision circuit REV_CIR may also generate and output a ROM control signal C_SEL together with the selected modified ROM data M#_ROM_DATA. The ROM control signal C_SEL may be enabled when a modified ROM data M#_ROM_DATA is selected by the revision circuit REV_CIR to be transferred to the selection circuit SC. Alternatively, when the select signal SEL_S is disabled, the revision circuit REV_CIR does not output the modified ROM data M#_ROM_DATA, and disables the ROM control signal C_SEL. The select signal SEL_S may be generated by the control logic LOG of FIG. 3, which operates in response to a command. For example, the control logic LOG may output the select signal SEL_S when the output data of the ROM needs to be modified.

The selection circuit SC may receive both of the independent signal ID_SIG and the modified ROM data M#_ROM_DATA and output final ROM data F_ROM_DATA in response to the ROM control signal C_SEL. The final ROM data F_ROM_DATA may select one between the independent signal ID_SIG and the modified ROM data M#_ROM_DATA as its output based on the ROM control signal C_SEL. That is, the selection circuit SC may output the independent signal ID_SIG or the modified ROM data M#_ROM_DATA in response to the ROM control signal C_SEL.

The revision circuit REV_CIR will be described in more detail as follows.

Figure 7:
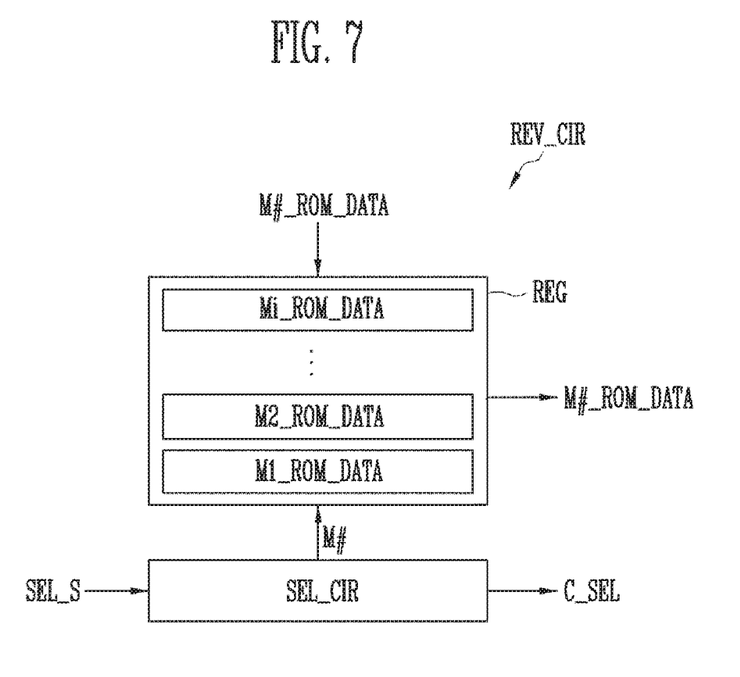
FIG. 7 is a diagram illustrating a revision circuit of FIG. 6.

FIG. 7 is a diagram illustrating the revision circuit REV_CIR of FIG. 6.

Referring to FIG. 7, the revision circuit REV_CIR may include a storage unit REG for storing the plural pieces of modified ROM data M#_ROM_DATA and a select circuit SEL_CIR for outputting a sector value M# and a ROM control signal C_SEL in response to a select signal SEL_S.

The plurality of modified ROM data M#_ROM_DATA may be stored in the storage unit REG according to a sector. For example, first to ith modified ROM data M1 to Mi_ROM_DATA (i is a positive integer) may be stored in the storage unit REG, and a selected modified ROM data M#_ROM_DATA may be output according to a sector value M#.

When the select signal SEL_S is received, the select circuit SEL_CIR may output a selected sector value M# and enable the ROM control signal C_SEL according to the select signal SEL_S. Alternatively, when the select signal SEL_S is received, the select circuit SEL_CIR may output the selected sector value M# and the ROM control signal C_SEL having a high logic. Also, when select signal SEL_S is not received, the select circuit SEL_CIR may output a default sector value M#, and the ROM control signal C_SEL is disabled. When the default sector value M# is output, the storage unit REG does not output the modified ROM data M#_ROM_DATA.

Figure 8:
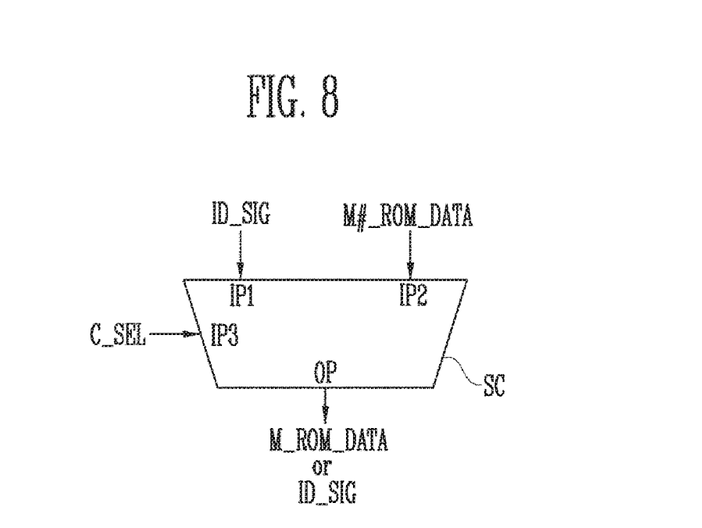
FIG. 8 is a diagram illustrating a selection circuit shown in FIG. 6.

FIG. 8 is a diagram illustrating the selection circuit of FIG. 6.

Referring to FIG. 8, the selection circuit SC may include first to third input terminals IP1 to IP3 and one output terminal OP. For example, an independent signal ID_SIG may be input to the first input terminal IP1, and the modified ROM data M#_ROM_DATA may be input to the second input terminal IP2. The ROM control signal C_SEL may be input to the third input terminal IP3.

The selection circuit SC may output the independent signal ID_SIG or the modified ROM data M#_ROM_DATA in response to the ROM control signal C_SEL. For example, when the ROM control signal C_SEL is disabled, the selection circuit SC may output the independent signal ID_SIG. When the ROM control signal C_SEL is enabled, the selection circuit SC may output the modified ROM data M#_ROM_DATA. Alternatively, when the ROM control signal C_SEL is low, the selection circuit SC may output the independent signal ID_SIG. When the ROM control signal C_SEL is high, the selection circuit SC may output the modified ROM data M#_ROM_DATA.

Figure 9:
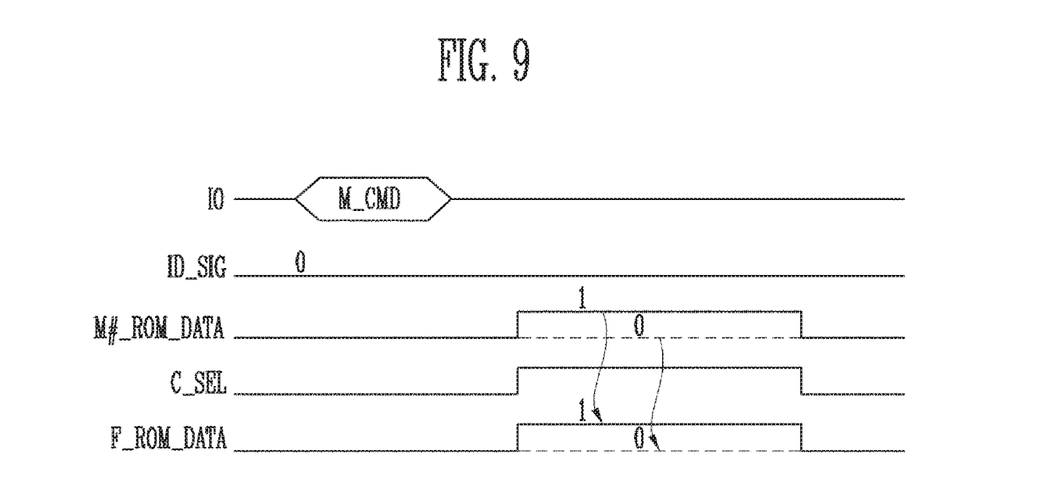
FIG. 9 is a diagram illustrating a driving method of the ROM MUX shown in FIG. 8.

FIG. 9 is a diagram illustrating a driving method of the selection circuit SC of FIG. 8.

Referring to FIG. 9, when a ROM modification command M_CMD is received from the memory controller 1200 of FIG. 1 through the input/output lines IO, the memory device 100 of FIG. 1 may perform a ROM modification operation. For example, when the independent signal ID_SIG having a value of '0' is required to be corrected, the modified ROM data M#_ROM_DATA stored in the storage unit REG of FIG. 7 may be output when the ROM control signal C_SEL is enabled to a high level. For example, when the modified ROM data M#_ROM_DATA is '1' the selection circuit SC may output data '1.' When the modified ROM data M#_ROM_DATA is '0,' the selection circuit SC may output data '0.' This is a case where the independent signal ID_SIG and the modified ROM data M#_ROM_DATA are the same. Therefore, the modified ROM data M#_ROM_DATA may be used when the reliability of the independent signal ID_SIG is low.

Figure 10:
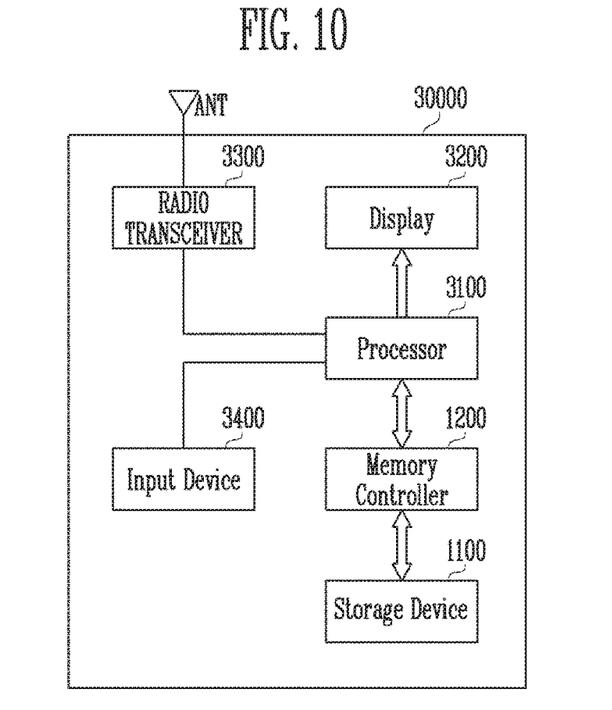
FIG. 10 is a diagram illustrating an embodiment of the memory system including a storage device shown in FIG. 1.

FIG. 10 is a diagram illustrating another embodiment of the memory system including a storage device shown in FIG. 1.

Referring to FIG. 10, the memory system 30000 may be implemented as a cellular phone, a smart phone, a tablet PC, a personal digital assistant (PDA), or a wireless communication device. The memory system 30000 may include a storage device 1100 and a memory controller 1200 capable of controlling an operation of the storage device 1100. The memory controller 1200 may control a data access operation of the storage device 1100, e.g., a program operation, an erase operation, a read operation, or the like under the control of a processor 3100.

Data programmed in the storage device 1100 may be output through a display 3200 under the control of the memory controller 1200. In addition, the plurality of memory devices 100 of FIG. 1 may be included in the storage device 1100, and each of the memory devices 100 may include ROM circuits ROM_CIR of FIG. 3.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor storage device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the storage device 1100 may be implemented as a part of the processor 3100, or be implemented as a chip separate from the processor 3100.

Figure 11:
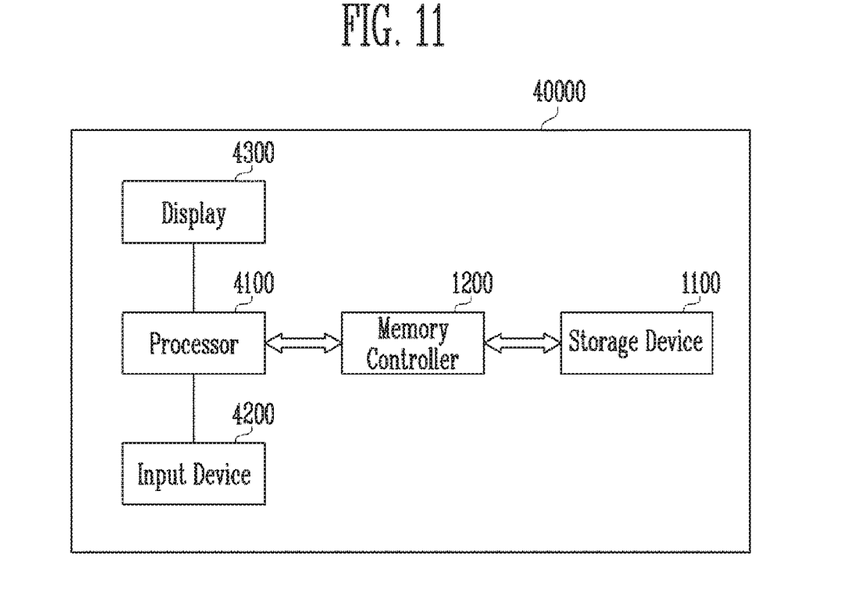
FIG. 11 is a diagram illustrating an embodiment of a memory system including a storage device in accordance with the present invention.

FIG. 11 is a diagram illustrating another embodiment of a memory system including a storage device in accordance with the present invention.

Referring to FIG. 11, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a storage device 1100 and a memory controller 1200 capable of controlling a data processing operation of the storage device 1100.

A processor 4100 may output data stored in the storage device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the storage device 1100 may be implemented as a part of the processor 4100, or be implemented as a chip separate from the processor 4100. In addition, the plurality of memory devices 100 of FIG. 1 may be included in the storage device 1100, and each of the memory devices 100 may include ROM circuits ROM_CIR of FIG. 3.

Figure 12:
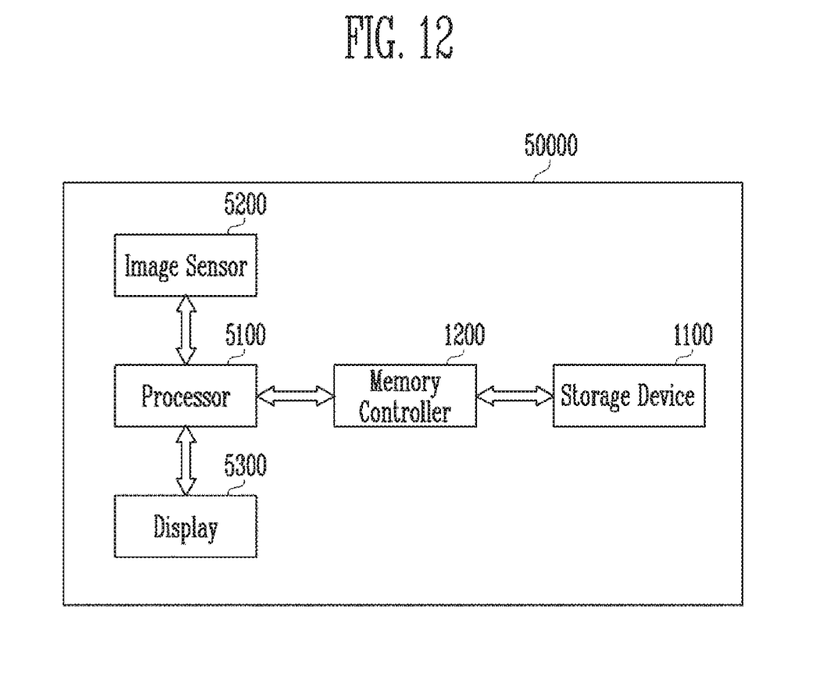
FIG. 12 is a diagram illustrating an embodiment of a memory system including a storage device in accordance with the present invention.

FIG. 12 is a diagram illustrating another embodiment of a memory system including a storage device in accordance with the present invention.

Referring to FIG. 12, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a storage device 1100 and a memory controller 1200 capable of controlling a data processing operation of the storage device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the storage device 1100 through the memory controller 1200. In addition, data stored in the storage device 1100 may be output through the display 5300 under the control of the processor 5100 or the memory controller 1200.

In some embodiments, the memory controller 1200 capable of controlling an operation of the storage device 1100 may be implemented as a part of the processor 5100, or be implemented as a chip separate from the processor 5100. In addition, the plurality of memory devices 100 of FIG. 1 may be included in the storage device 1100, and each of the memory devices 100 may include ROM circuits ROM_CIR of FIG. 3.

Figure 13:
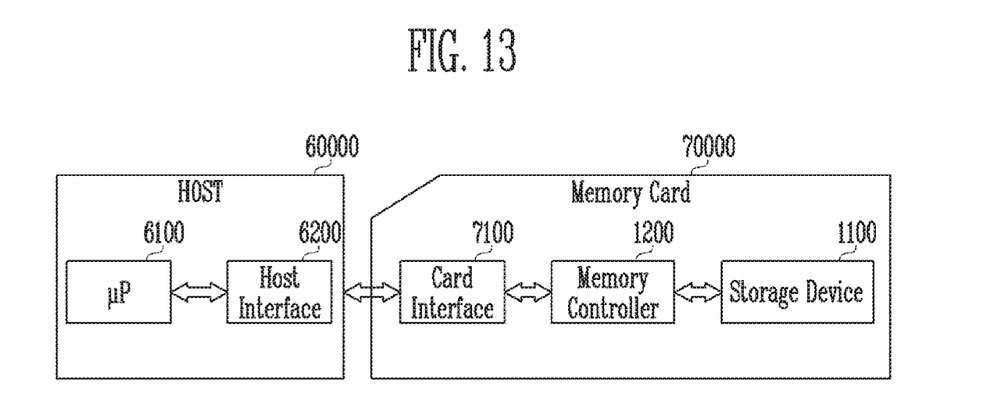
FIG. 13 is a diagram illustrating an embodiment of a memory system including a storage device in accordance with the present invention.

FIG. 13 is a diagram illustrating another embodiment of a memory system including a storage device in accordance with the present invention.

Referring to FIG. 13, the memory system 70000 may be implemented as a memory card or a smart card. The memory system 70000 may include a storage device 1100, a memory controller 1200, and a card interface 7100.

The memory controller 1200 may control data exchange between the storage device 1100 and the card interface 7100. The plurality of memory devices 100 of FIG. 1 may be included in the storage device 1100, and each of the memory devices 100 may include ROM circuits ROM_CIR of FIG. 3. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the storage device 1100 through the card interface 7100 and the memory controller 1200 under the control of a microprocessor (μP) 6100.

In accordance with the present disclosure, revision of the ROM included in the memory device having the three-dimensional structure can be performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
    an independent circuit configured to output an independent signal;
    a memory cell array formed on a top of the independent circuit, the memory cell array including a plurality of memory cells in which data is stored;
    a revision circuit formed on a top of the memory cell array, the revision circuit storing modified ROM data different from the independent signal, the revision circuit outputting a ROM control signal and the modified ROM data in response to a select signal when an error occurs in the independent signal in a test operation of the independent circuit formed under the memory cell array; and
    a selection circuit configured to output the independent signal or the modified ROM data in response to the ROM control signal.

2. The memory device of claim 1, wherein the memory cell array includes a plurality of memory blocks configured in a three-dimensional structure.

3. The memory device of claim 1, wherein the revision circuit includes:
    a storage unit configured to store the modified ROM data according to a sector; and
    a select circuit configured to output a sector value and the ROM control signal in response to the select signal.

4. The memory device of claim 3, wherein the select circuit:
    outputs the sector value and the ROM control signal when the select signal is enabled; and
    outputs a default sector value and disables the ROM control signal when the select signal is disabled.

5. The memory device of claim 3, wherein the storage unit outputs modified ROM data selected according to the sector value.

6. The memory device of claim 3, wherein the storage unit does not output the modified ROM data when the sector value is a default sector value.

7. The memory device of claim 1, wherein the selection circuit receives the independent signal and the modified ROM data, and selectively outputs the independent signal or the modified ROM data in response to the ROM control signal.

8. The memory device of claim 7, wherein the selection circuit:
    outputs the modified ROM data when the ROM control signal is enabled; and
    outputs the independent signal when the ROM control signal is disabled.

9. The memory device of claim 1, further comprising operating circuits configured to perform a program, read or erase operation on the memory cell array.

10. The memory device of claim 9, wherein the operating circuits are formed on the bottom of a NAND ROM and the selection circuit, and are formed on a top of a substrate.

11. The memory device of claim 9, wherein the operating circuits include:
    a control logic configured to various operation control signals in response to a command and an address, which are received from a memory controller;

a voltage generation circuit configured to generate a program voltage, a read voltage or an erase voltage in response to the operation control signals;

a row decoder configured to transmit operating voltages generated by the voltage generation circuit to a selected memory block included in the memory cell array according to a row address included in the address;

a column decoder configured to exchange data with an input/output circuit according to a column address included in the address;

the input/output circuit configured to transmit the command and the address, which are received through input/output lines, to the control logic in response to the operation control signals, and exchange data with the column decoder; and the NAND ROM configured to store system data.

12. The memory device of claim 11, wherein the input/output circuit transmits the independent signal or the modified ROM data, which is output from the selection circuit, to the memory controller through the input/output lines.

13. A memory device comprising:
operating circuits formed on a top of a substrate;
an independent circuit formed on a top of the operating circuits, the independent circuit outputting an independent signal;
a selection circuit formed on the top of the operating circuits, the selection circuit outputting the independent signal or modified ROM data in response to a ROM control signal;
a memory cell array formed on a top of a NAND ROM and the selection circuit; and
a revision circuit formed on a top of the memory cell array, the revision circuit transmitting the modified ROM data to the selection circuit in response to a select signal.

14. The memory device of claim 13, wherein the operating circuits output the independent signal or the modified ROM data, which is output from the selection circuit, to a memory controller.

15. The memory device of claim 14, wherein the operating circuits performs a program, read or erase operation of the memory cell array in response to a command and an address, which are received from the memory controller, or controls the NAND ROM, the selection circuit, and the revision circuit.

16. The memory device of claim 14, wherein the operating circuits include:
a control logic configured to output various operation control signals in response to the command and the address;
a voltage generation circuit configured to generate a program voltage, a read voltage or an erase voltage in response to the operation control signals;
a row decoder configured to transmit operating voltages generated by the voltage generation circuit to a selected memory block included in the memory cell array according to a row address included in the address;
a column decoder configured to exchange data with an input/output circuit according to a column address included in the address;
the input/output circuit configured to transmit the command and the address, which are received through input/output lines, to the control logic in response to the operation control signals, and exchange data with the column decoder; and
the NAND ROM configured to store system data.

17. The memory device of claim 16, wherein the control logic outputs the select signal for controlling the revision circuit in response to the command.

18. The memory device of claim 17, wherein the revision circuit includes:
a storage unit configured to store the modified ROM data according to a sector; and
a select circuit configured to output a sector value and the ROM control signal in response to the select signal.

19. The memory device of claim 18, wherein the select circuit:
outputs the sector value and the ROM control signal when the select signal is enabled; and
outputs a default sector value and disables the ROM control signal when the select signal is disabled.

20. The memory device of claim 19, wherein the storage unit:
outputs modified ROM data selected according to the sector value; and
does not output the modified ROM data when the sector value is a default sector value.

21. A memory system comprising:
a memory device configured to store user data and output an independent signal; and
a memory controller configured to transmit a modification command to the memory device to modify and output the independent signal,
wherein the memory device includes:
a memory cell array configured to store the user data;
an independent circuit formed on a bottom of the memory cell array, the independent circuit outputting the independent signal;
a revision circuit formed on a top of the memory cell array, the revision circuit storing modified ROM data different from the independent signal, the revision circuit outputting a ROM control signal and the modified ROM data in response to a select signal; and
a selection circuit configured to output the independent signal or the modified ROM data in response to the ROM control signal.

* * * * *